(12) United States Patent
Grabowski et al.

(10) Patent No.: US 10,169,140 B2
(45) Date of Patent: Jan. 1, 2019

(54) LOADING A PHASE-LOCKED LOOP (PLL) CONFIGURATION USING FLASH MEMORY

(71) Applicant: International Business Machines Corporation, Armonk, NY (US)

(72) Inventors: Gerald M. Grabowski, Kellogg, MN (US); Daniel F. Moertl, Rochester, MN (US); Michael J. Palmer, Southampton (GB); Kelvin Wong, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 15/296,279

(22) Filed: Oct. 18, 2016

(65) Prior Publication Data

US 2018/0107538 A1 Apr. 19, 2018

(51) Int. Cl.
*G06F 11/10* (2006.01)
*G11C 7/00* (2006.01)

(52) U.S. Cl.
CPC .......... *G06F 11/1044* (2013.01); *G11C 7/00* (2013.01)

(58) Field of Classification Search
CPC ...... G06F 3/061; G06F 3/0619; G06F 3/0629; G06F 3/0647; G06F 3/0679; G06F 21/554; G06F 21/64
See application file for complete search history.

(56) References Cited

U.S. PATENT DOCUMENTS

| 7,557,663 | B2 * | 7/2009 | Rubin | G06F 1/30 327/159 |
| 7,876,124 | B2 | 1/2011 | Okyay et al. | |
| 8,038,239 | B2 * | 10/2011 | Walmsley | B41J 2/04505 347/14 |
| 8,265,219 | B1 | 9/2012 | Hronik | |
| 2006/0284688 | A1 | 12/2006 | Miki | |

OTHER PUBLICATIONS

"Fast PLL Lock Time with Self-Calibrated PLL Lock Aid Acquisition", Disclosed Anonymously, IP.com Prior Art Database Technical Disclosure No. IPCOM000143778D dated Dec. 8, 2006, 3 pages.

* cited by examiner

*Primary Examiner* — Nadeem Iqbal
(74) *Attorney, Agent, or Firm* — Francis Lammes; Stephen J. Walder, Jr.; Robert M. Sullivan

(57) ABSTRACT

A mechanism is provided for loading a phase-locked loop (PLL) configuration into a PLL module using Flash memory. A Flash data image configuration from the Flash memory is loaded into a set of holding registers in response to the PLL module locking a current PLL configuration from a set of current configuration registers. The Flash data image configuration in the set of holding registers is compared to the current PLL configuration in the set of current configuration registers in response to the Flash data image configuration failing to be corrupted. The Flash data image configuration onto a PLL module input in response to the Flash data image configuration differing from the current PLL configuration. The Flash data image configuration is loaded in the set of holding registers into the set of current configuration registers in response to the PLL module locking the Flash data image configuration.

20 Claims, 10 Drawing Sheets

LOADING A PHASE-LOCKED LOOP (PLL) CONFIGURATION USING FLASH MEMORY

BACKGROUND

The present application relates generally to an improved data processing apparatus and method and more specifically to mechanisms for loading a phase-locked loop (PLL) configuration using Flash memory.

A phase-locked loop (PLL) is a control system that generates an output signal whose phase is related to the phase of an input signal. While there are several differing types of PLLs, a PLL may be visualized as an electronic circuit consisting of a variable frequency oscillator and a phase detector. The variable frequency oscillator generates a periodic signal, and the phase detector compares the phase of that signal with the phase of the input periodic signal, adjusting the variable frequency oscillator to keep the phases matched. Bringing the output signal back toward the input signal for comparison is called a feedback loop since the output is "fed back" toward the input forming a loop.

Phase-locked loop (PLL) modules are used to set internal clock frequencies at which a device, for example a core synchronous logic of an Application Specific Integrated Circuit (ASIC), operates. These PLL modules have many inputs (over 100 typically) that configure the PLL to produce one or more clock signals of certain frequencies. A default setting for these inputs will be determined during a design phase of the device in which the PLL operates. The PLL module will have a reset, which will be driven by the device's logic during initialization, at which point the PLL will apply a set of default settings upon the reset to lock at the desired frequency. The default settings will be designed into the device internal ground/positive power supply (GND/VDD) ties to the PLL module inputs.

SUMMARY

This Summary is provided to introduce a selection of concepts in a simplified form that are further described herein in the Detailed Description. This Summary is not intended to identify key factors or essential features of the claimed subject matter, nor is it intended to be used to limit the scope of the claimed subject matter.

In one illustrative embodiment, a method, in a data processing system, is provided for loading a phase-locked loop (PLL) configuration into a PLL module using Flash memory. Responsive to the PLL module locking a current PLL configuration from a set of current configuration registers, the illustrative embodiment loads a Flash data image configuration from the Flash memory into a set of holding registers. Responsive to the Flash data image configuration failing to be corrupted, the illustrative embodiment compares the Flash data image configuration in the set of holding registers to the current PLL configuration in the set of current configuration registers. Responsive to the Flash data image configuration differing from the current PLL configuration, the illustrative embodiment loads the Hash data image configuration onto a PLL module input. Responsive to the PLL module locking the Flash data image configuration, the illustrative embodiment loads the Flash data image configuration in the set of holding registers into the set of current configuration registers.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
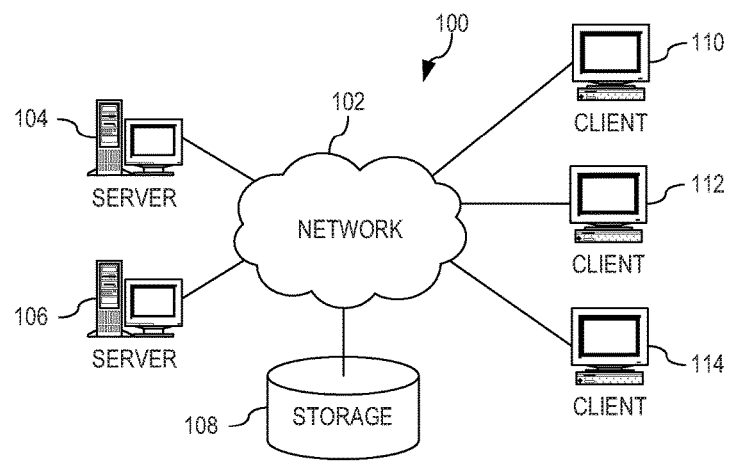
FIG. 1 is an example diagram of a distributed data processing system in which aspects of the illustrative embodiments may be implemented.

Again, phase-locked loop (PLL) modules are used to set internal clock frequencies at which a device, for example a core synchronous logic of an Application Specific Integrated Circuit (ASIC), operates. Each device may have multiple PLL modules in order to produce different frequency clock signals for different functions. Each PLL nodule has its own set of default setting to use for configuration. Furthermore, it is likely that a single device may be used in different applications. Each application may possibly require each PLL module to produce its own unique set of clock frequencies. As such, using the same default settings for each PLL module may not be possible. The ability to change a PLL module's setting at the device's power-on time would thus be advantageous. Another reason for changing a PLL module's setting at the device's power-on time would be to provide a way of "tweaking" the PLL settings from the designed default to optimize its performance after the design phase.

Therefore, the illustrative embodiments provide mechanisms for efficiently initializing multiple PLL modules within a device. There are typically two standard ways of initializing functions such as a PLL module within a device: using strapping resistors or using a Hash memory loaded with configuration settings. Using the strapping resistors, should an individual PLL module's configuration be required to be different from the default (for a particular application), the PLL may have its inputs set at reset time; each input being tied high or low. Typically, the device will have strapping resistors, which link directly to each PLL module's inputs. These pins may then be tied high or low using pullup or pulldown resistors external to the device. However, one issue with using strapping resistors is finding real estate on the printed circuit board (PCB), on which the device is mounted, for potentially over 100 pullup and pulldown resistors (one for each PLL module input) may be impractical. Once the device reset occurs, these pullups and pulldowns will have served their purpose to configure the PLLs and have no further function. Thus, valuable space is wasted on a PCB, which could have been used for other functions or removed altogether to reduce costs. Furthermore, if the device contains multiple PLL modules, multiple sets of strapping resistors are required thereby making the space wastage even worse.

Using Flash memory, functions (such as PLLs) within a device may be used for configuration at boot time. The drawback with this solution is that, as Flash memory gets denser, the Flash memory is prone to multiple bit errors. Errors in the data image contained in the Flash memory may lead to misconfiguration of the PLL, which may prevent the PLL from locking. This leads to unstable behavior within the device and the potential for the device to fail completely and unrecoverably thereby making the device unusable and totally uncommunicative with the rest of the hardware system. Furthermore, while loading a boot configuration using the Flash memory is a well-known solution, it should be noted that loading PLL configurations using this Flash memory might not be practical. This is because without the locked PLL and the clock it generates, synchronous logic within the device may not function, particularly the device's interface with the Flash memory. This interface is needed to load the PLL configuration to allow the PLL to lock and function in the first place.

Thus, the illustrative embodiments provide for using Flash memory to load a device's PLL configuration at boot time while ensuring that any errors in the Flash data image on the Flash memory (and hence with the PLL configuration contained within) do not prevent the PLL from locking. Data on Flash memory is typically protected using checking methods such as Hamming codes, Error-Correcting Code (ECC), Longitudinal Redundancy Check (LRC), or Cyclic Redundancy Code (CRC). The illustrative embodiments initialize the device using known default configuration settings (already hard wired into the device design). These settings are guaranteed to cause the PLL to lock (but perhaps not at the frequency required by the particular application). Any PLL configuration information contained within the Flash data image on the Flash memory is loaded into holding registers whilst the Flash data image configuration is checked for any data corruption. Should data corruption be detected or if the Flash data image on the Flash memory is erased, the illustrative embodiments ignore the PLL settings in the Flash memory and allow the device to boot with the default PLL configuration. The illustrative embodiments then provides an indication to the user that there was a problem with using the Flash data image configuration on the Flash memory so that remedial action can be taken, such as re-writing the Flash data image configuration to the Flash memory.

Should the Flash data image configuration be error-free, the illustrative embodiments compare the PLL configuration from the Flash data image with the default configuration on the device. If the two configurations differ in any way, the illustrative embodiments drive the PLL module inputs with the PLL configuration identified in the Flash data image from the Flash memory and reset the PLL module so that the PLL module boots at the desired dock frequency. Alternatively, the Flash data image configuration may optionally comprise a flag which, when set, indicates that the default configuration should be overridden with the Flash data image configuration.

The mechanisms of the illustrative embodiments have the advantage over the strapping resistors implementation in that the instant mechanisms do not rely on using pullups/pulldowns to configure the PLL module. This saves on PCB space and using a Flash memory means that PLL configuration is more flexible. The Flash data image configuration may be upgraded while the PCB is in the field. Further, the mechanisms of the illustrative embodiments have the advantage over the standard method of Flash memory initialization as the instant mechanisms will not allow a corrupted Flash data image configuration to initialize the PLL module, which would prevent the PLL from locking. The device may still operate (albeit using default PLL settings). Running in this mode may be acceptable until the Flash data image configuration is corrected (by reloading the Flash data image configuration). At the very least the device is operational enough to report the initialization problem which it would not have been possible had the corrupted Flash data image configuration prevented the PLL from locking and thus prevented the device from functioning at all.

In another embodiment, the mechanisms use two Flash data image configurations: a primary Flash data image configuration and a secondary Flash data image configuration. If the mechanisms find the primary Flash data image configuration to be corrupted or if the primary Flash data image on the Flash memory is erased, then the mechanisms read the secondary Flash data image configuration and, if not corrupted, use the secondary Flash data image configuration configure the PLL (assuming the secondary image configuration differed from the default). The advantage of this embodiment is that there is a backup configuration to fall back on. Another advantage is that the PLL configuration could be updated in the field without having to power down the system. One could erase and update the primary Flash data image configuration first, safe in the knowledge that if a reset occurs in the meantime to interrupt the update, and the mechanisms would switch to the secondary Flash data image configuration. Once the primary Flash data image configuration was safely updated, the secondary Flash data image configuration would be updated.

Before beginning the discussion of the various aspects of the illustrative embodiments, it should first be appreciated that throughout this description the term "mechanism" will be used to refer to elements of the present invention that perform various operations, functions, and the like. A "mechanism," as the term is used herein, may be an implementation of the functions or aspects of the illustrative embodiments in the form of an apparatus, a procedure, or a computer program product. In the case of a procedure, the procedure is implemented by one or more devices, apparatus, computers, data processing systems, or the like. In the case of a computer program product, the logic represented by computer code or instructions embodied in or on the computer program product is executed by one or more hardware devices in order to implement the functionality or perform the operations associated with the specific "mechanism." Thus, the mechanisms described herein may be implemented as specialized hardware, software executing on general-purpose hardware, software instructions stored on a medium such that the instructions are readily executable by specialized or general-purpose hardware, a procedure or method for executing the functions, or a combination of any of the above.

The present description and claims may make use of the terms "a", "at least one of", and "one or more of" with regard to particular features and elements of the illustrative embodiments. It should be appreciated that these terms and phrases are intended to state that there is at least one of the particular feature or element present in the particular illustrative embodiment, but that more than one can also be present. That is, these terms/phrases are not intended to limit the description or claims to a single feature/element being present or require that a plurality of such features/elements be present. To the contrary, these terms/phrases only require at least a single feature/element with the possibility of a plurality of such features/elements being within the scope of the description and claims.

Moreover, it should be appreciated that the use of the term "engine," if used herein with regard to describing embodiments and features of the invention, is not intended to be limiting of any particular implementation for accomplishing and/or performing the actions, steps, processes, etc., attributable to and/or performed by the engine. An engine may be, but is not limited to, software, hardware and/or firmware or any combination thereof that performs the specified functions including, but not limited to, any use of a general and/or specialized processor in combination with appropriate software loaded or stored in a machine readable memory and executed by the processor. Further, any name associated with a particular engine is, unless otherwise specified, for purposes of convenience of reference and not intended to be limiting to a specific implementation. Additionally, any functionality attributed to an engine may be equally performed by multiple engines, incorporated into and/or combined with the functionality of another engine of the same or different type, or distributed across one or more engines of various configurations.

In addition, it should be appreciated that the following description uses a plurality of various examples for various elements of the illustrative embodiments to further illustrate example implementations of the illustrative embodiments and to aid in the understanding of the mechanisms of the illustrative embodiments. These examples intended to be non-limiting and are not exhaustive of the various possibilities for implementing the mechanisms of the illustrative embodiments. It will be apparent to those of ordinary skill in the art in view of the present description that there are many other alternative implementations for these various elements that may be utilized in addition to, or in replacement of, the examples provided herein without departing from the spirit and scope of the present invention.

Figure 2:
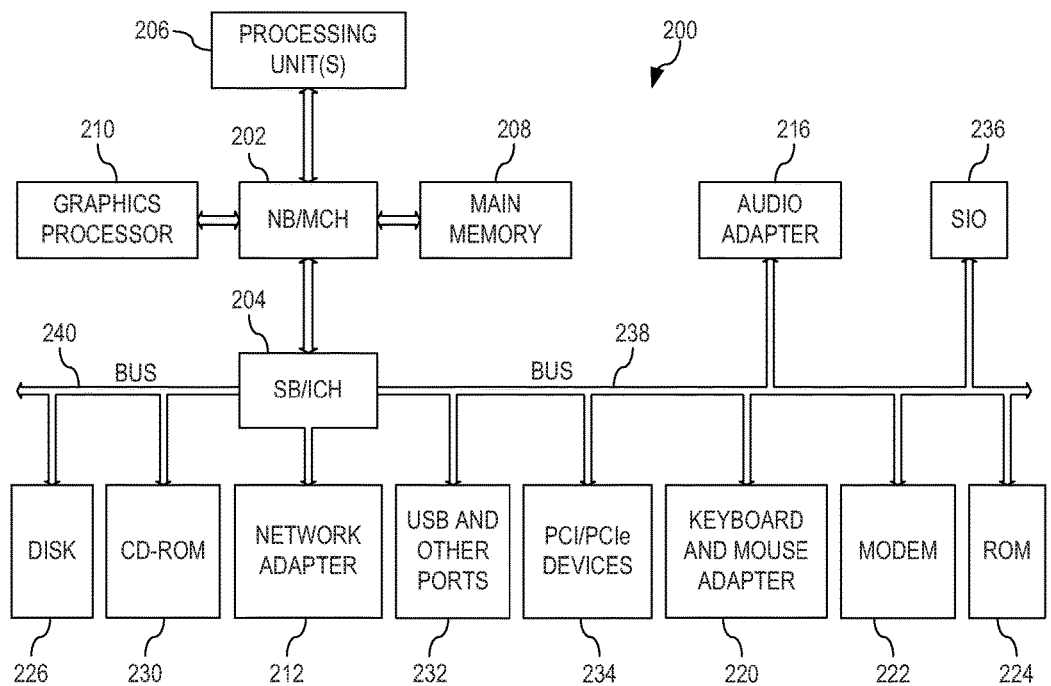
FIG. 2 is an example block diagram of a computing device in which aspects of the illustrative embodiments may be implemented.

Thus, the illustrative embodiments may be utilized in many different types of data processing environments. In order to provide a context for the description of the specific elements and functionality of the illustrative embodiments, FIGS. 1 and 2 are provided hereafter as example environments in which aspects of the illustrative embodiments may be implemented. It should be appreciated that FIGS. 1 and 2 are only examples and are not intended to assert or imply any limitation with regard to the environments in which aspects or embodiments of the present invention may be implemented. Many modifications to the depicted environments may be made without departing from the spirit and scope of the present invention.

FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

As shown in FIG. 1, one or more of the computing devices, e.g., server 104, may be specifically configured to implement a mechanism for loading a phase-locked loop (PLL) configuration using a Flash memory. The configuring of the computing device may comprise the providing of application specific hardware, firmware, or the like to facilitate the performance of the operations and generation of the outputs described herein with regard to the illustrative embodiments. The configuring of the computing device may also, or alternatively, comprise the providing of software applications stored in one or more storage devices and loaded into memory of a computing device, such as server 104, for causing one or more hardware processors of the computing device to execute the software applications that configure the processors to perform the operations and generate the outputs described herein with regard to the illustrative embodiments. Moreover, any combination of application specific hardware, firmware, software applications executed on hardware, or the like, may be used without departing from the spirit and scope of the illustrative embodiments.

It should be appreciated that once the computing device is configured in one of these ways, the computing device becomes a specialized computing device specifically configured to implement the mechanisms of the illustrative embodiments and is not a general-purpose computing device. Moreover, as described hereafter, the implementation of the mechanisms of the illustrative embodiments improves the functionality of the computing device and provides a useful and concrete result that facilitates loading a phase-locked loop (PLL) configuration using a Flash memory.

As noted above, the mechanisms of the illustrative embodiments utilize specifically configured computing devices, or data processing systems, to perform the operations for loading a phase-locked loop (PLL) configuration using a Flash memory. These computing devices, or data processing systems, may comprise various hardware elements that are specifically configured, either through hardware configuration, software configuration, or a combination of hardware and software configuration, to implement one or more of the systems/subsystems described herein. FIG. 2 is a block diagram of just one example data processing system in which aspects of the illustrative embodiments may be implemented. Data processing system 200 is an example of a computer, such as server 104 in FIG. 1, in which computer usable code or instructions implementing the processes and aspects of the illustrative embodiments of the present invention may be located and/or executed to achieve the operation, output, and external effects of the illustrative embodiments as described herein.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows 7®. An object-oriented programming system, such as the Java™ programming system, may run in conjunction with the operating system and provides calls to the operating system from Java™ programs or applications executing on data processing system 200.

As a server, data processing system 200 may be, for example, an IBM eServer™ System p® computer system, Power™ processor based computer system, or the like, running the Advanced Interactive Executive (AIX®) operating system or the LINUX® operating system. Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

As mentioned above, in some illustrative embodiments the mechanisms of the illustrative embodiments may be implemented as application specific hardware, firmware, or the like, application software stored in a storage device, such as HDD 226 and loaded into memory, such as main memory 208, for executed by one or more hardware processors, such as processing unit 206, or the like. As such, the computing device shown in FIG. 2 becomes specifically configured to implement the mechanisms of the illustrative embodiments and specifically configured to perform the operations and generate the outputs described hereafter with regard to the loading a phase-locked loop (PLL) configuration using a Flash memory.

Those of ordinary skill in the art will appreciate that the hardware in FIGS. 1 and 2 may vary depending on the implementation. Other internal hardware or peripheral devices, such as Flash memory, equivalent non-volatile memory, or optical disk drives and the like, may be used in addition to or in place of the hardware depicted in FIGS. 1 and 2. In addition, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device that is configured with Flash memory to provide non-volatile memory for storing operating system files and/or user-generated data, for example. Essentially, data processing system 200 may be any known or later developed data processing system without architectural limitation.

Figure 3:
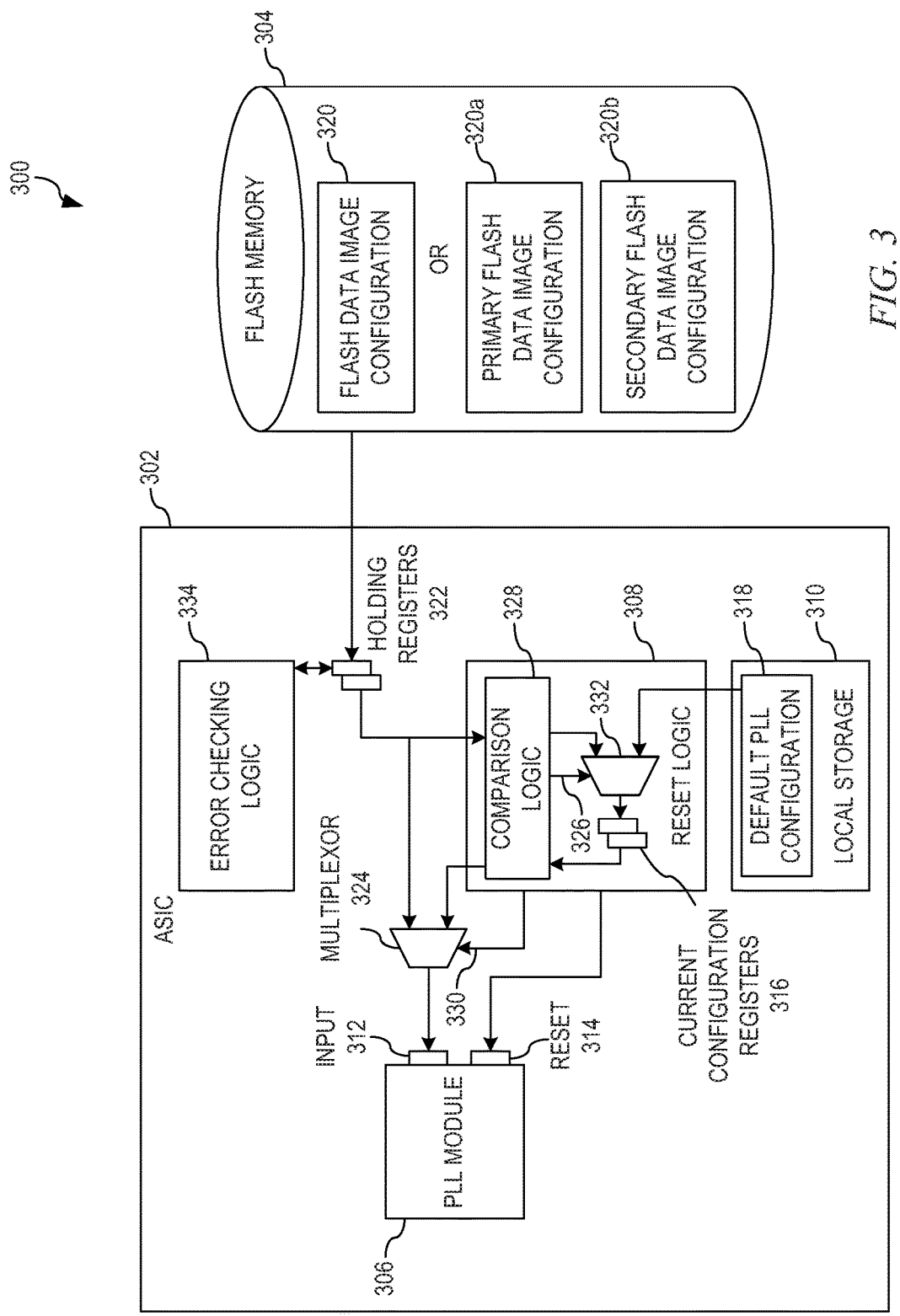
FIG. 3 depicts an exemplary block diagram of a mechanism for loading a phase-locked loop (PLL) configuration into a PLL module using Flash memory in accordance with an illustrative embodiment.

FIG. 3 depicts an exemplary block diagram of a mechanism for loading a phase-locked loop (PLL) configuration into a PLL module using Flash memory in accordance with an illustrative embodiment. The following example describes loading a PLL configuration into an single PLL module of an Application Specific Integrated Circuit (ASIC) at boot time using Flash memory while ensuring that any errors in the Flash data image (and hence with the PLL configuration contained within) do not prevent the PLL from locking. While the example uses an ASIC, it will be apparent to those of ordinary skill in the art in view of the present description that there are many other alternative implementations for these various elements that may be utilized in addition to, or in replacement of, the examples provided herein without departing from the spirit and scope of the present invention.

Accordingly, data processing system 300 comprises an Application Specific Integrated Circuit (ASIC) 302 and Flash memory 304. ASIC 302 further comprise PLL module 306, reset logic 308, and local storage 310. Reset logic 308 of ASIC 302 configures PLL module 306 by loading a PLL configuration at input 312 and asserting reset line 314 of PLL module 306. Reset logic 308 comprises a set of current configuration registers 316 that hold the current configuration for PLL module 306. The current configuration registers 316 are loaded with a PLL configuration either from default PLL configuration 318 in local storage 310 or from Flash data image configuration 320 in Flash memory 304 that is held in a set of holding registers 322 coupled to Flash memory 304. Default PLL configuration 318 is guaranteed to cause PLL module 306 to lock by design. Thus, the set of holding registers 322 is coupled to one input branch of multiplexor 324 and the set of current configuration registers 316 is coupled to the other input branch of multiplexor 324. The output of multiplexor 324 then feeds the inputs of PLL module 306. Note that reset logic 308 runs off a clock (not shown) which is external to ASIC 302 so that reset logic 308 is not dependent upon PLL module 308 that reset logic 308 is configuring.

On power-on, reset logic 308 determines that no configuration is currently in the set of current configuration registers 316 and initially loads default PLL configuration 318 into the set of current configuration registers 316 via multiplexor 332 based on selection signal 326 from comparison logic 328 indicating a comparison has not yet been conducted, since no PLL configuration exists in the set of holding registers 322, or the PLL configuration in the set of holding registers 322 is the same as the PLL configuration in the set of current configuration registers 316. Based on selection signal 326 indicating that a comparison has not yet been conducted, since no PLL configuration exists in the set of holding registers 322, or the PLL configuration in the set of holding registers 322 is the same as the PLL configuration in the set of current configuration registers 316, reset logic 308 asserts selection signal 330 so that the PLL configuration (i.e. default PLL configuration 318) in the set of current configuration registers 316 is multiplexed via multiplexor 324 onto PLL module input 312. Reset module 308 then resets PLL module 306 by asserting reset line 314 so that PLL module 306 takes the PLL configuration from the set of current configuration registers 316. Reset logic 308 then waits for PLL module 306 to lock.

Once PLL Module 306 has locked, the rest of ASIC 302 is now functional, particularly the interface to Flash memory 304. With the interface to Flash memory 304 active, reset logic 308 loads Flash data image configuration 320 in Flash memory 304 into the set of holding registers 322. Error checking logic 334 reads Flash data image configuration 320 now in the set of holding registers 322 and checks Flash data image configuration 320 for data integrity using error checking such as Hamming codes, Error-Correcting Code (ECC), Longitudinal Redundancy Check (LRC), or Cyclic Redundancy Code (CRC).

If error checking logic 334 determines that Flash data image configuration 320 is corrupted or if the Flash data image configuration 320 is erased, then error checking logic 334 sets a "Bad Flash Data Image" flag that causes reset logic 308 to notify the user that Flash PLL configuration using the Flash data image configuration 320 has failed. If error-checking logic 334 determines that Flash data image configuration 320 is not corrupt, comparison logic 328 compares Flash data image configuration 320 in the set of holding registers 322 to default PLL configuration 318 in the set of current configuration registers 316. If comparison logic 328 determines that Flash data image configuration 320 is the same as default PLL configuration 318, then reset logic 308 recognizes that PLL module 306 is configured with the most up-to-date PLL configuration and the process ends.

If comparison logic 328 determines that Flash data image configuration 320 differs from default PLL configuration 318, reset logic 308 asserts selection signal 330 so that Flash data image configuration 320 in the set of holding registers 322 is multiplexed via multiplexor 324 onto PLL module input 312. Reset module 308 then resets PLL module 306 by asserting reset line 314 so that PLL module 306 takes the PLL configuration from the set of holding registers 322. Reset logic 308 then waits for PLL module 306 to lock. Finally, since Flash data image configuration 320 differs from default PLL configuration 318, reset logic 308 loads Flash data image configuration 320 in the set of holding registers 322 into the set of current configuration registers 316, with the operation ending thereafter.

Should ASIC 306 undergo a warm or hot reset (in both types of reset, power to ASIC 306 remains but the entire ASIC logic is reset including PLL module 306, which is different from a cold reset which occurs at power on), the process is repeated except for initially loading default PLL configuration 318 into the set of current configuration registers 316 as a PLL configuration will already exist in the set of current configuration registers 316.

When checking whether Flash data image configuration 320 is corrupted, it is also possible to check that the image is blank, i.e. erased. This would be in the form of Flash data image configuration 320 containing a 1 in every bit. This is optional and typically, a good ECC algorithm would return an uncorrectable error status anyway. Note that Flash data image configuration 320 could also be used to initialize other parts/features of ASIC 302 (not just PLL module 306), e.g. configuring interface speeds or memory window sizes. That is, hardware and firmware configuration registers of ASIC 302 are used to customize hardware functions and others configuration registers are used to signal firmware of hardware or firmware states or status or card configurations. Some of these registers are read only by the firmware, while other registers are read/write. Some read-only registers control hardware settings, while read/write registers control hardware settings. All of these registers are considered "sticky", i.e. on a "cold power on" the registers are set to a default value, then optionally overwritten by the Flash data image configuration of the illustrative embodiments, but for other reset types, the value of these registers do not change. Furthermore, multiple PLL modules may be configured with the same Flash data image configuration 320.

In another embodiment, rather than comparing Flash data image configuration 320 to default PLL configuration 318, a flag in Flash data image configuration 320 would indicate that default PLL configuration 318 was to be overridden with Flash data image configuration 320. In this event, on power-on, reset logic 306 determines that no configuration is currently in the set of current configuration registers 316 and initially loads default PLL configuration 318 into the set of current configuration registers 316 via multiplexor 332 based on selection signal 326 from comparison logic 328 indicating a comparison has not yet been conducted, since no PLL configuration exists in the set of holding registers 322, or the PLL configuration in the set of holding registers 322 is the same as the PLL configuration in the set of current configuration registers 316. Based on selection signal 326 indicating that a comparison has not yet been conducted, since no PLL configuration exists in the set of holding registers 322, or the PLL configuration in the set of holding registers 322 is the same as the PLL configuration in the set of current configuration registers 316, reset logic 308 asserts selection signal 330 so that the PLL configuration (i.e. default PLL configuration 318) in the set of current configuration registers 316 is multiplexed via multiplexor 324 onto PLL module input 312. Reset module 308 then resets PLL module 306 by asserting reset line 314 so that PLL module 306 takes the PLL configuration from the set of current configuration registers 316. Reset logic 308 then waits for PLL module 306 to lock.

Once PLL Module 306 has locked, the rest of ASIC 302 is now functional, particularly the interface to Flash memory 304. With the interface to Flash memory 304 active, reset logic 308 loads Flash data image configuration 320 in Flash memory 304 into the set of holding registers 322. Error checking logic 334 reads Flash data image configuration 320 now in the set of holding registers 322 and checks Flash data image configuration 320 for data integrity using error checking such as Hamming codes, Error-Correcting Code (ECC), Longitudinal Redundancy Check (LRC), or Cyclic Redundancy Code (CRC).

If error checking logic 334 determines that Flash data image configuration 320 is corrupted or if the Flash data image configuration is erased, then error checking logic 334 sets a "Bad Flash Data Image" flag that causes reset logic 308 to notify the user that Flash PLL configuration using the Flash data image configuration 320 has failed. If error-checking logic 334 determines that Flash data image configuration 320 is not corrupt, reset logic 308 determines whether Flash data image configuration 320 comprises a flag indicating that Flash data image configuration 320 is a new PLL configuration. If reset logic 308 determines that no flag is present, then the process ends.

If reset logic 308 determines that a flag is present indicating that Flash data image configuration 320 is to replace default PLL configuration 318, then reset logic 308 asserts selection signal 330 so that Flash data image configuration 320 in the set of holding registers 322 is multiplexed via multiplexor 324 onto PLL module input 312. Reset module 308 then resets PLL module 306 by asserting reset line 314 so that PLL module 306 takes the PLL configuration from the set of holding registers 322. Reset logic 308 then waits for PLL module 306 to lock. Finally, since Flash data image configuration 320 differs from default PLL configuration 318, reset logic 308 loads Flash data image configuration 320 in the set of holding registers 322 into the set of current configuration registers 316, with the operation ending thereafter.

In yet another embodiment, data processing system 300 may comprise an Application Specific Integrated Circuit (ASIC) 302 and Flash memory 304 with two Flash data image configurations 320, i.e. a primary Flash data image configuration 320a and a secondary Flash data image configuration 320b, or two Flash memories 304a and 304b with Flash memory 304a comprising primary Flash data image configuration 320a and Flash memory 304b comprising secondary Flash data image configuration 320b. In this embodiment, on power-on, reset logic 306 determines that no configuration is currently in the set of current configuration registers 316 and initially loads default PLL configuration 318 into the set of current configuration registers 316 via multiplexor 332 based on selection signal 326 from comparison logic 328 indicating a comparison has not yet been conducted, since no PLL configuration exists in the set of holding registers 322, or the PLL configuration in the set of holding registers 322 is the same as the PLL configuration in the set of current configuration registers 316. Based on selection signal 326 indicating that a comparison has not yet been conducted, since no PLL configuration exists in the set of holding registers 322, or the PLL configuration in the set of holding registers 322 is the same as the PLL configuration in the set of current configuration registers 316, reset logic 308 asserts selection signal 330 so that the PLL configuration (i.e. default PLL configuration 318) in the set of current configuration registers 316 is multiplexed via multiplexor 324 onto PLL module input 312. Reset module 308 then resets PLL module 306 by asserting reset line 314 so that PLL module 306 takes the PLL configuration from the set of current configuration registers 316. Reset logic 308 then waits for PLL module 306 to lock.

Once PLL Module 306 has locked, the rest of ASIC 302 is now functional, particularly the interface to Flash memory 304. With the interface to Flash memory 304 active, reset logic 308 loads primary Flash data image configuration 320a in Flash memory 304 into the set of holding registers 322. Error checking logic 334 reads primary Flash data image configuration 320a now in the set of holding registers 322 and checks primary Flash data image configuration 320a for data integrity using error checking such as Hamming codes, Error-Correcting Code (ECC), Longitudinal Redundancy Check (LRC), or Cyclic Redundancy Code (CRC).

If error-checking logic 334 determines that primary Flash data image configuration 320a is not corrupt, comparison logic 328 compares primary Flash data image configuration 320a in the set of holding registers 322 to default PLL configuration 318 in the set of current configuration registers 316. If comparison logic 328 determines that primary Flash data image configuration 320a is the same as default PLL configuration 318, reset logic 308 recognizes that PLL module 306 is configured with the most up-to-date PLL configuration and the process ends.

If comparison logic 328 determines that primary Flash data image configuration 320a differs from default PLL configuration 318, reset logic 308 asserts selection signal 330 so that primary Flash data image configuration 320a in the set of holding registers 322 is multiplexed via multiplexor 324 onto PLL module input 312. Reset module 308 then resets PLL module 306 by asserting reset line 314 so that PLL module 306 takes the PLL configuration from the set of holding registers 322. Reset logic 308 then waits for PLL module 306 to lock. Finally, since primary Flash data image configuration 320a differs from default PLL configuration 318, reset logic 308 loads primary Flash data image configuration 320a in the set of holding registers 322 into the set of current configuration registers 316, with the operation ending thereafter.

If error checking logic 334 determines that primary Flash data image configuration 320a is corrupted or if the primary Flash data image configuration 320a is erased, then error checking logic 334 sets a "Bad Flash Data Image" flag that causes reset logic 308 to notify the user that Flash PLL configuration using the primary Flash data image configuration 320a has failed. Reset logic 308 loads secondary Flash data image configuration 320b in Flash memory 304 into the set of holding registers 322. Error checking logic 334 reads secondary Flash data image configuration 320b now in the set of holding registers 322 and checks secondary Flash data image configuration 320b for data integrity using error checking such as Hamming codes, Error-Correcting Code (ECC), Longitudinal Redundancy Check (LRC), or Cyclic Redundancy Code (CRC).

If error checking logic 334 determines that secondary Flash data image configuration 320b is corrupted or if secondary Flash data image configuration 320b is erased, then error checking logic 334 sets a "Bad Flash Data Image" flag that causes reset logic 308 to notify the user that Flash PLL configuration using the secondary Flash data image configuration 320b has failed. If error-checking logic 334 determines that secondary Flash data image configuration 320b is not corrupted, comparison logic 328 compares secondary Flash data image configuration 320b in the set of holding registers 322 to default PLL configuration 318 in the set of current configuration registers 316. If comparison logic 328 determines that secondary Flash data image configuration 320b is the same as default PLL configuration 318, reset logic 308 recognizes that PLL module 306 is configured with the most up-to-date PLL configuration and the process ends.

If comparison logic 328 determines that secondary Flash data image configuration 320b differs from default PLL configuration 318, reset logic 308 asserts selection signal 330 so that secondary Flash data image configuration 320b in the set of holding registers 322 is multiplexed via multiplexor 324 onto PLL module input 312. Reset module 308 then resets PLL module 306 by asserting reset line 314 so that PLL module 306 takes the PLL configuration from the set of holding registers 322. Reset logic 308 then waits for PLL module 306 to lock. Finally, since secondary Flash data image configuration 320b differs from default PLL configuration 318, reset logic 308 loads secondary Flash data image configuration 320b in the set of holding registers 322 into the set of current configuration registers 316, with the operation ending thereafter.

The present invention may be a system, a method, and/or a computer program product. The computer program product may include a computer readable storage medium (or media) having computer readable program instructions thereon for causing a processor to early out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products, according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart anchor block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Figure 4A:
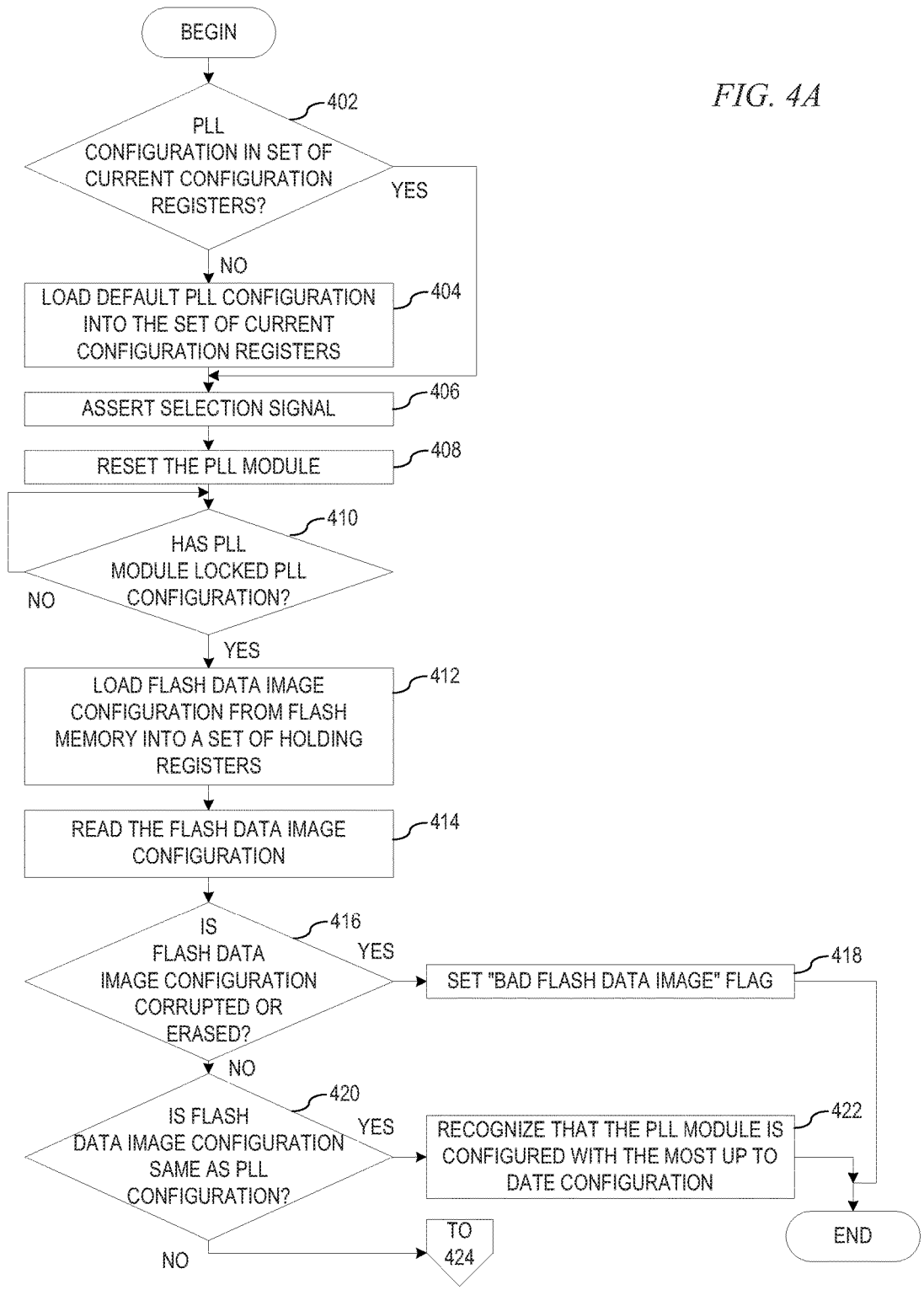
FIGS. 4A and 4B depict a flowchart of the operation performed by a mechanism for loading a phase-locked loop (PLL) configuration into a PLL module within a device using a comparison of a PLL configuration to a Flash data image configuration from a Flash memory in accordance with an illustrative embodiment.
Figure 4B:
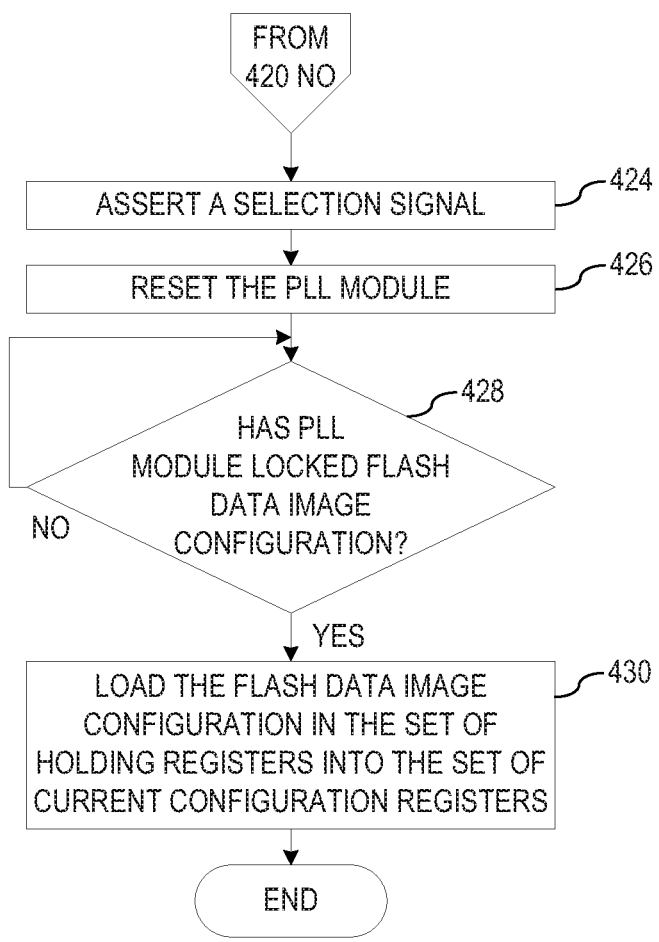

FIGS. 4A and 4B depict a flowchart of the operation performed by a mechanism for loading a phase-locked loop (PLL) configuration into a PLL module within a device using a comparison of a configuration to a Flash data image configuration from a Flash memory in accordance with an illustrative embodiment. As the operation begins, the PLL configuration loading mechanism determines whether there is a PLL configuration already loaded into a set of current configuration registers (step 402). If at step 402 the PLL configuration loading mechanism determines that no configuration existing in the set of current configuration registers, the PLL configuration loading mechanism loads a default PLL configuration into the set of current configuration registers (step 404). The PLL configuration loading mechanism asserts a selection signal so that the PLL configuration in the set of current configuration registers is multiplexed onto a PLL module input (step 406). The PLL configuration loading mechanism resets the PLL module by asserting a reset line (step 408) so that the PLL module takes the PLL configuration from the set of current configuration registers. The PLL configuration loading mechanism then determines whether the PLL module has locked the PLL configuration (step 410). If at step 410 the PLL configuration loading mechanism determines that the PLL module has not locked the PLL configuration, then the operation returns to step 410 to wait for the PLL module to lock.

If at step 410 the PLL configuration loading mechanism determines that the PLL module has locked the PLL configuration, which causes the rest of the device to be functional, particularly the interface to Flash memory, the PLL configuration loading mechanism loads a Flash data image configuration from the Flash memory into a set of holding registers (step 412). The PLL configuration loading mechanism then reads the Flash data image configuration now in the set of holding registers (step 414) and determines whether the Flash data image configuration is corrupted or erased (step 416) using error checking such as Hamming codes, Error-Correcting Code (ECC), Longitudinal Redundancy Check (LRC), or Cyclic Redundancy Code (CRC).

If at step 416 the PLL configuration loading mechanism determines that the Flash data image configuration is corrupted or erased, the PLL configuration loading mechanism sets a "Bad Flash Data Image" flag (step 418) that notifies a user that Flash PLL configuration using the Flash data image configuration has failed, with the operation terminating thereafter. If at step 416 the PLL configuration loading mechanism determines that the Flash data image configuration is not corrupted or erased, the PLL configuration loading mechanism determines whether the Flash data image configuration in the set of holding registers is the same as the PLL configuration in the set of current configuration registers (step 420). If at step 420 the PLL configuration loading mechanism determines that Flash data image configuration in the set of holding registers is the same as the PLL configuration in the set of current configuration registers, the PLL configuration loading mechanism recognizes that the PLL module is configured with the most up-to-date PLL configuration (step 422), with the operation terminating thereafter.

If at step 420 the PLL configuration loading mechanism determines that Flash data image configuration in the set of holding registers is different than the PLL configuration in the set of current configuration registers, the PLL configuration loading mechanism asserts a selection signal so that the Flash data image configuration in the set of holding registers is multiplexed onto the PLL module input (step 424). The PLL configuration loading mechanism then resets the PLL module by asserting the reset line so that the PLL module takes the Flash data image configuration from the set of holding registers (step 426). The PLL configuration loading mechanism then determines whether the PLL module has locked the Flash data image configuration (step 428). If at step 428 the PLL configuration loading mechanism determines that the PLL module has not locked the Flash data image configuration, then the operation returns to step 428 to wait for the PLL module to lock.

If at step 428 the PLL configuration loading mechanism determines that the PLL module has locked the Flash data image configuration, PLL configuration loading mechanism loads the Flash data image configuration in the set of holding registers into the set of current configuration registers (step 430), with the operation ending thereafter. Returning to step 402, if at step 402 the PLL configuration loading mechanism determines that a PLL configuration exists in the set of current configuration registers, the operation proceeds to step 406.

Figure 5A:
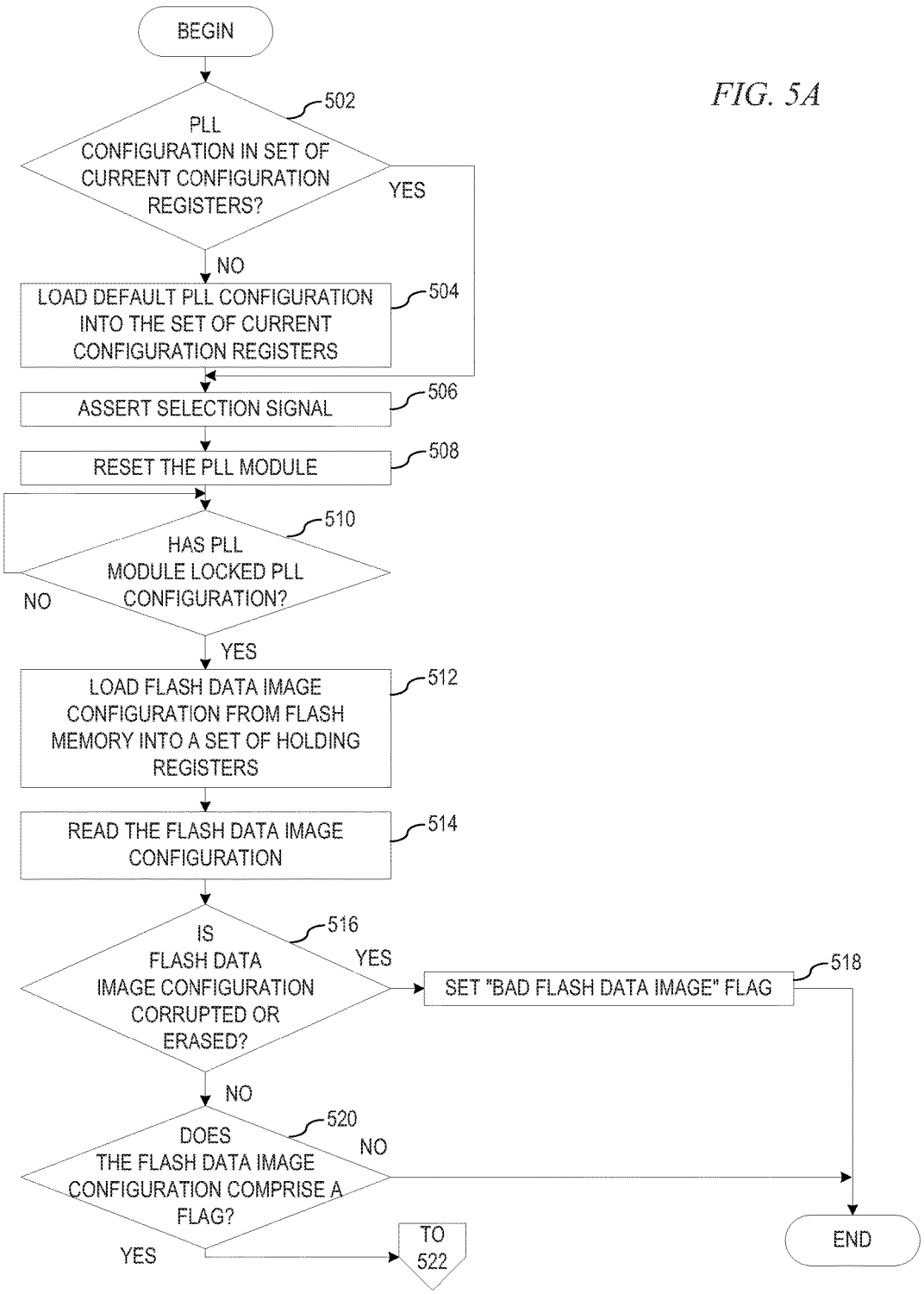
FIGS. 5A and 5B depict a flowchart of the operation performed by a mechanism for loading a Flash data image configuration from a Flash memory into a PLL module within a device based on a flag indicating that a current PLL configuration is to be overridden in accordance with an illustrative embodiment.
Figure 5B:
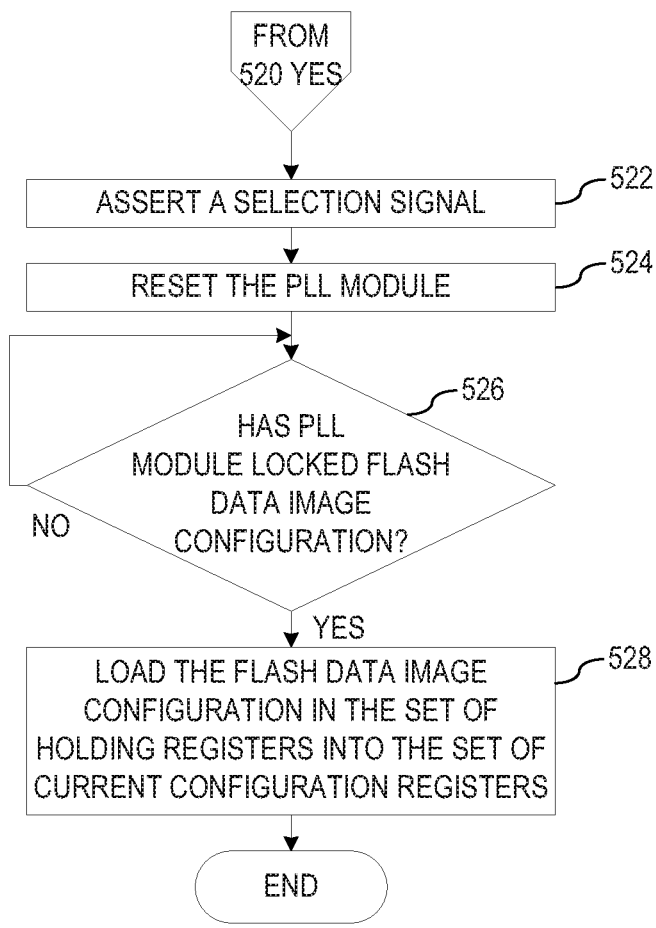

FIGS. 5A and 5B depict a flowchart of the operation performed by a mechanism for loading a Flash data image configuration from a Flash memory into a PLL module within a device based on a flag indicating that a current PLL configuration is to be overridden in accordance with an illustrative embodiment. As the operation begins, the PLL configuration loading mechanism determines whether there is a PLL configuration already loaded into a set of current configuration registers (step 502). If at step 502 the PLL configuration loading mechanism determines that no configuration existing in the set of current configuration registers, the PLL configuration loading mechanism loads a default PLL configuration into the set of current configuration registers (step 504). The PLL configuration loading mechanism asserts a selection signal so that the PLL configuration in the set of current configuration registers is multiplexed onto a PLL module input (step 506). The PLL configuration loading mechanism resets the PLL module by asserting a reset line (step 508) so that the PLL module takes the PLL configuration from the set of current configuration registers. The PLL configuration loading mechanism then determines whether the PLL module has locked the PLL configuration (step 510). If at step 510 the PLL configuration loading mechanism determines that the PLL module has not locked the PLL configuration, then the operation returns to step 510 to wait for the PLL module to lock.

If at step 510 the PLL configuration loading mechanism determines that the PLL module has locked the PLL configuration, which causes the rest of the device to be functional, particularly the interface to Flash memory, the PLL configuration loading mechanism loads a Flash data image configuration from the Flash memory into a set of holding registers (step 512). The PLL configuration loading mechanism then reads the Flash data image configuration now in the set of holding registers (step 514) and determines whether the Flash data image configuration is corrupted or erased (step 516) using error checking such as Hamming codes, Error-Correcting Code (ECC), Longitudinal Redundancy Check (LRC), or Cyclic Redundancy Code (CRC).

If at step 516 the PLL configuration loading mechanism determines that the Flash data image configuration is corrupted or erased, the PLL configuration loading mechanism sets a "Bad Flash Data Image" flag (step 518) that notifies a user that Flash PLL configuration using the Flash data image configuration has failed, with the operation terminating thereafter. If at step 516 the PLL configuration loading mechanism determines that the Flash data image configuration is not corrupted or erased, the PLL configuration loading mechanism determines whether the Flash data image configuration comprises a flag indicating that the Flash data image configuration is a new PLL configuration (step 520). If at step 520 the PLL configuration loading mechanism determines that no flag is present, then the operation ends. If at step 520 the PLL configuration loading mechanism determines that a flag is present thereby indicating that the Flash data image configuration is to replace the default PLL configuration, the PLL configuration loading mechanism asserts a selection signal so that the Flash data image configuration in the set of holding registers is multiplexed onto the PLL module input (step 522). The PLL configuration loading mechanism then resets the PLL module by asserting the reset line so that the PLL module takes the PLL configuration from the set of holding registers (step 524). The PLL configuration loading mechanism then determines whether the PLL module has locked the Flash data image configuration (step 526). If at step 526 the PLL configuration loading mechanism determines that the PLL module has not locked the Flash data image configuration, then the operation returns to step 526 to wait for the PLL module to lock.

If at step 526 the PLL configuration loading mechanism determines that the PLL module has locked the Flash data image configuration, PLL configuration loading mechanism loads the Flash data image configuration in the set of holding registers into the set of current configuration registers (step 528), with the operation ending thereafter. Returning to step 502, if at step 502 the PLL configuration loading mechanism determines that a PLL configuration exists in the set of current configuration registers, the operation proceeds to step 506.

Figure 6A:
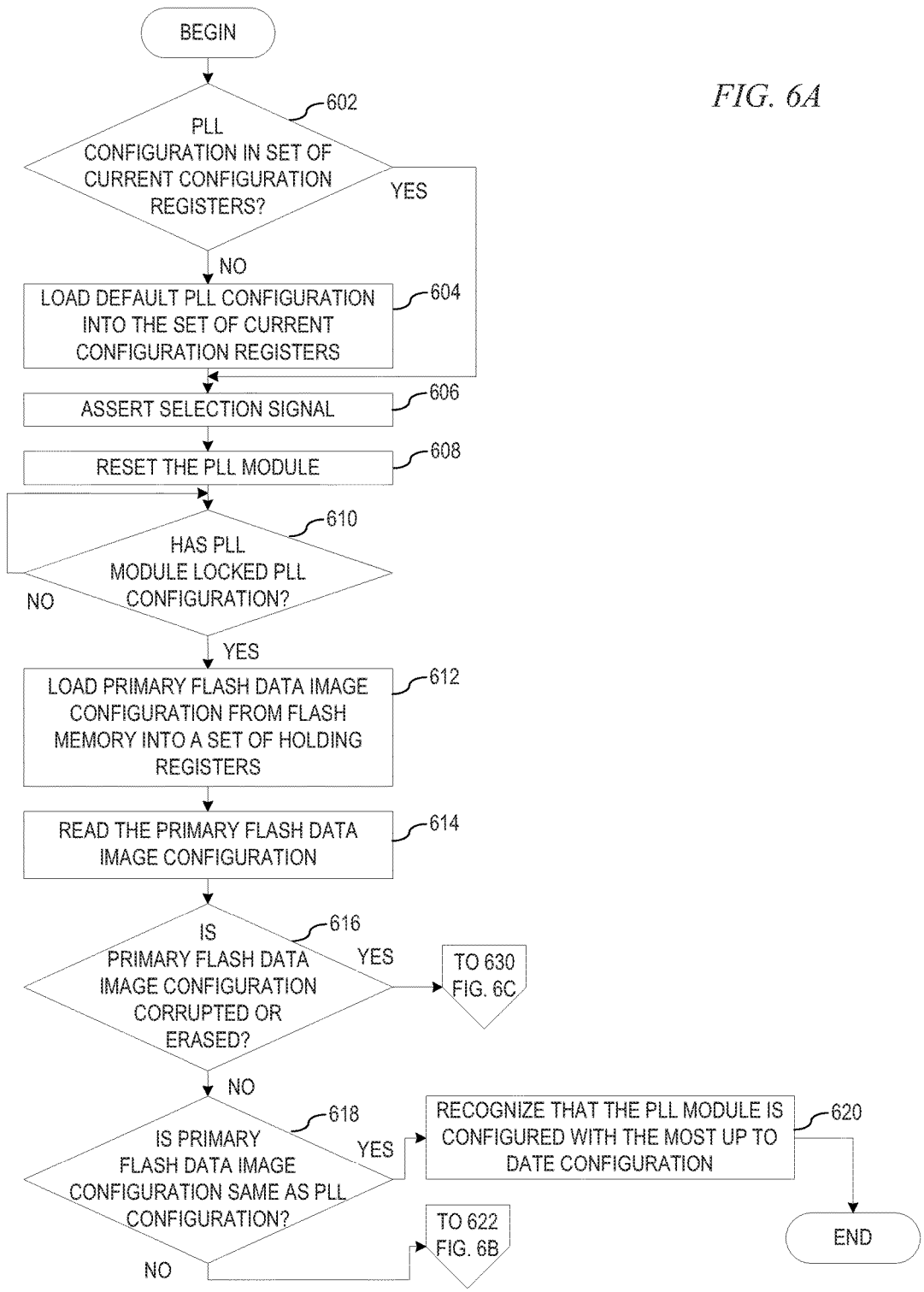
FIGS. 6A-6C depicts a flowchart of the operation performed by a mechanism for loading a phase-locked loop (PLL) configuration into a PLL module within a device using a comparison of a PLL configuration to a primary Flash data image configuration and, if necessary, a second Flash data image configuration from a Flash memory in accordance with an illustrative embodiment.
Figure 6B:
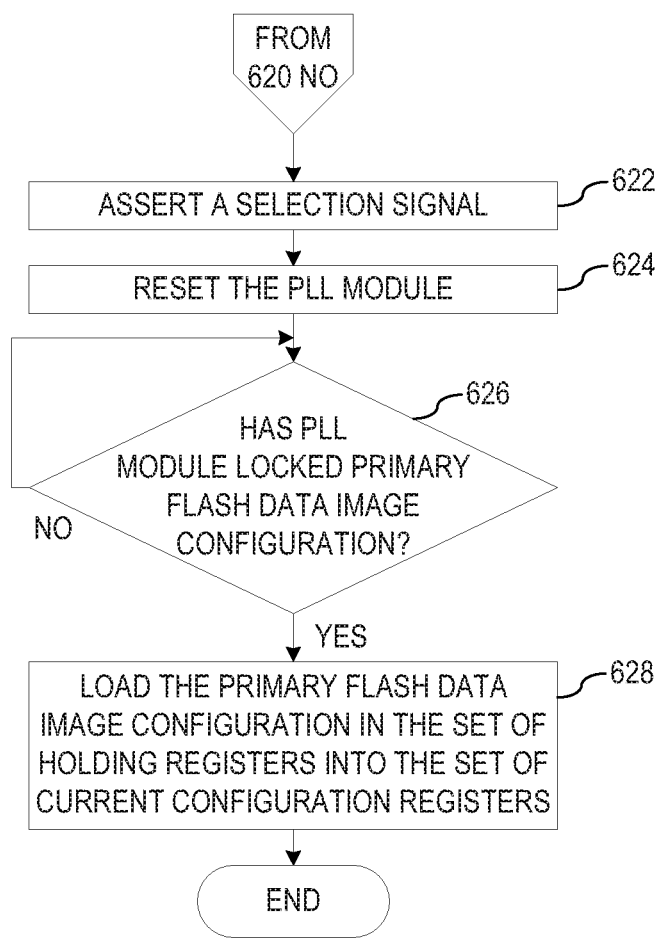
Figure 6C:
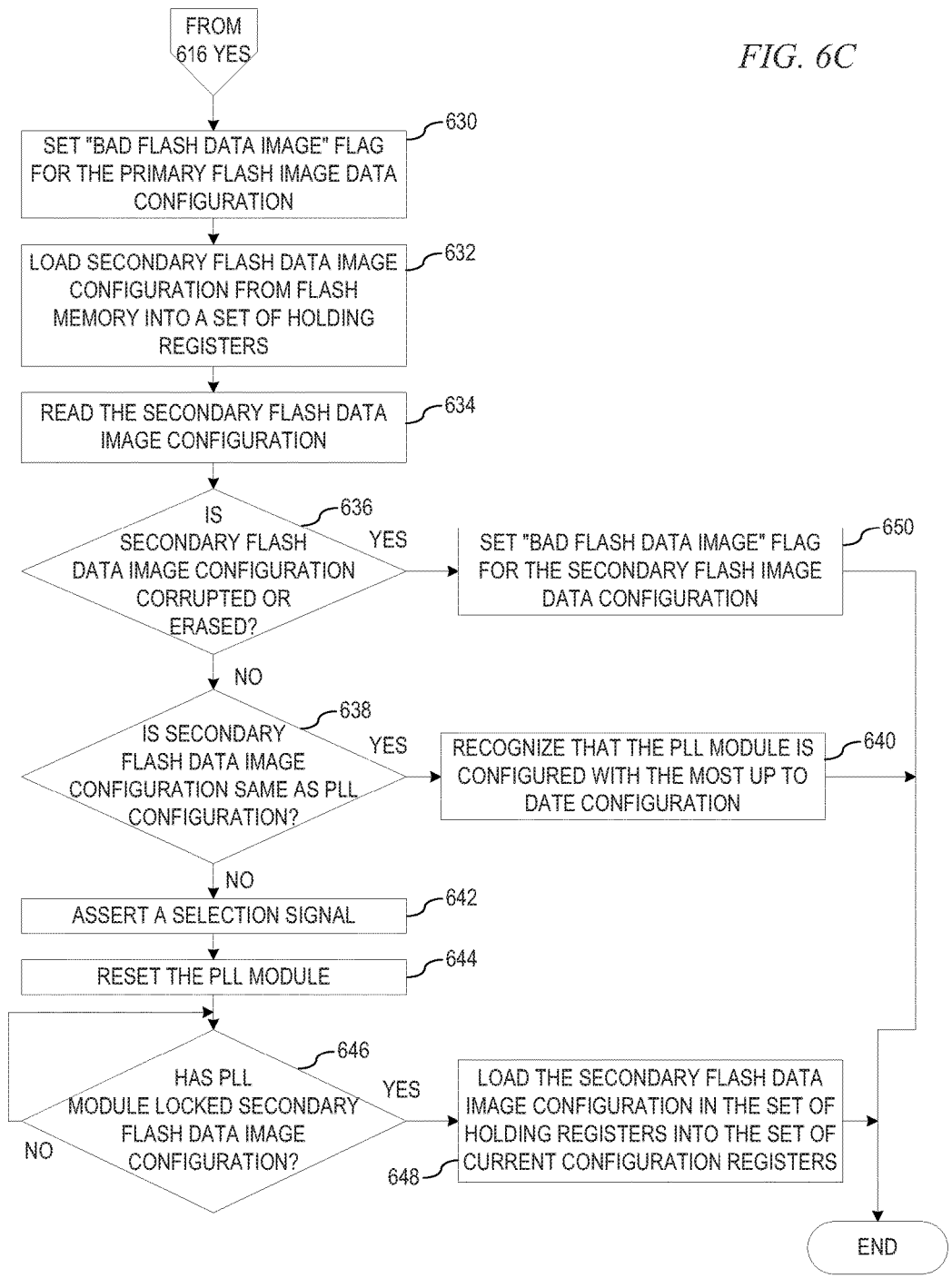

FIGS. 6A-6C depicts a flowchart of the operation performed by a mechanism for loading a phase-locked loop (PLL) configuration into a PLL module within a device using a comparison of a PLL configuration to a primary Flash data image configuration and, if necessary, a second Flash data image configuration from a Flash memory in accordance with an illustrative embodiment. As the operation begins, the PLL configuration loading mechanism determines whether there is a PLL configuration already loaded into a set of current configuration registers (step 602). If at step 602 the PLL configuration loading mechanism determines that no configuration existing in the set of current configuration registers, the PLL configuration loading mechanism loads a default PLL configuration into the set of current configuration registers (step 604). The PLL configuration loading mechanism asserts a selection signal so that the PLL configuration in the set of current configuration registers is multiplexed onto a PLL module input (step 606). The PLL configuration loading mechanism resets the PLL module by asserting a reset line (step 608) so that the PLL module takes the PLL configuration from the set of current configuration registers. The PLL configuration loading mechanism then determines whether the PLL module has locked the PLL configuration (step 610). If at step 610 the PLL configuration loading mechanism determines that the PLL module has not locked the PLL configuration, then the operation returns to step 610 to wait for the PLL module to lock.

If at step 610 the PLL configuration loading mechanism determines that the PLL module has locked the PLL configuration, which causes the rest of the device to be functional, particularly the interface to Flash memory, the PLL configuration loading mechanism loads a primary Flash data image configuration from the Flash memory into a set of holding registers (step 612). The PLL configuration loading mechanism then reads the primary Flash data image configuration now in the set of holding registers (step 614) and determines whether the primary Flash data image configuration is corrupted or erased (step 616) using error checking such as Hamming codes, Error-Correcting Code (ECC), Longitudinal Redundancy Check (LRC), or Cyclic Redundancy Code (CRC).

If at step 616 the PLL configuration loading mechanism determines that the primary Flash data image configuration is not corrupted or erased, the PLL configuration loading mechanism determines whether the primary Flash data image configuration in the set of holding registers is the same as the PLL configuration in the set of current configuration registers (step 618). If at step 618 the PLL configuration loading mechanism determines that primary Flash data image configuration in the set of holding registers is the same as the PLL configuration in the set of current configuration registers, the PLL configuration loading mechanism recognizes that the PLL module is configured with the most up-to-date PLL configuration (step 620), with the operation terminating thereafter.

If at step 618 the PLL configuration loading mechanism determines that primary Flash data image configuration in the set of holding registers is different than the PLL configuration in the set of current configuration registers, the PLL configuration loading mechanism asserts a selection signal so that, the primary Flash data image configuration in the set of holding registers is multiplexed onto the PLL module input (step 622). The PLL configuration loading mechanism then resets the PLL module by asserting the reset line so that the PLL module takes the PLL configuration from the set of holding registers (step 624). The PLL configuration loading mechanism then determines whether the PLL module has locked the primary Flash data image configuration (step 626). If at step 626 the PLL configuration loading mechanism determines that the PLL module has not locked the primary Flash data image configuration, then the operation returns to step 626 to wait for the PLL module to lock.

If at step 626 the PLL configuration loading mechanism determines that the PLL module has locked the primary Flash data image configuration, the PLL configuration loading mechanism loads the primary Flash data image configuration in the set of holding registers into the set of current configuration registers (step 628), with the operation ending thereafter. Returning to step 602, if at step 602 the PLL configuration loading mechanism determines that a PLL configuration exists in the set of current configuration registers, the operation proceeds to step 606.

Returning to step 616, if at step 616 the PLL configuration loading mechanism determines that the primary Flash data image configuration is corrupted or erased, the PLL configuration loading mechanism sets a "Bad Flash Data Image" flag (step 630) that notifies a user that Flash PLL configuration using the primary Flash data image configuration has failed. The PLL configuration loading mechanism then loads a secondary Flash data image configuration from the Flash memory into a set of holding registers (step 632). The PLL configuration loading mechanism then reads the secondary Flash data image configuration now in the set of holding registers (step 634) and determines whether the secondary Flash data image configuration is corrupted or erased (step 636) using error checking such as Hamming codes, Error-Correcting Code (ECC), Longitudinal Redundancy Check (LRC), or Cyclic Redundancy Code (CRC).

If at step 636 the PLL configuration loading mechanism determines that the secondary Flash data image configuration is not corrupted or erased, the PLL configuration loading mechanism determines whether the secondary Flash data image configuration in the set of holding registers is the same as the PLL configuration in the set of current configuration registers (step 638). If at step 638 the PLL configuration loading mechanism determines that secondary Flash data image configuration in the set of holding registers is the same as the PLL configuration in the set of current configuration registers, the PLL configuration loading mechanism recognizes that the PLL module is configured with the most up-to-date PLL configuration (step 640), with the operation terminating thereafter.

If at step 638 the PLL configuration loading mechanism determines that secondary Flash data image configuration in the set of holding registers is different than the PLL configuration in the set of current configuration registers, the PLL configuration loading mechanism asserts a selection signal so that the secondary Flash data image configuration in the set of holding registers is multiplexed onto the PLL module input (step 642). The PLL configuration loading mechanism then resets the PLL module by asserting the reset line so that the PLL module takes the PLL configuration from the set of holding registers (step 644). The PLL configuration loading mechanism then determines whether the PLL module has locked the secondary Flash data image configuration (step 646). If at step 646 the PLL configuration loading mechanism determines that the PLL module has not locked the secondary Flash data image configuration, then the operation returns to step 646 to wait for the PLL module to lock.

If at step 646 the PLL configuration loading mechanism determines that the PLL module has locked the secondary Flash data image configuration, the PLL configuration loading mechanism loads the secondary Flash data image configuration in the set of holding registers into the set of current configuration registers (step 648), with the operation ending thereafter. Returning to step 636, if at step 636 the PLL configuration loading mechanism determines that the secondary Flash data image configuration is corrupted or erased, the PLL configuration loading mechanism sets a "Bad Flash Data Image" flag (step 650) that notifies a user that Flash PLL configuration using the secondary Flash data image configuration has failed, with the operation terminating thereafter.

Figure 7:
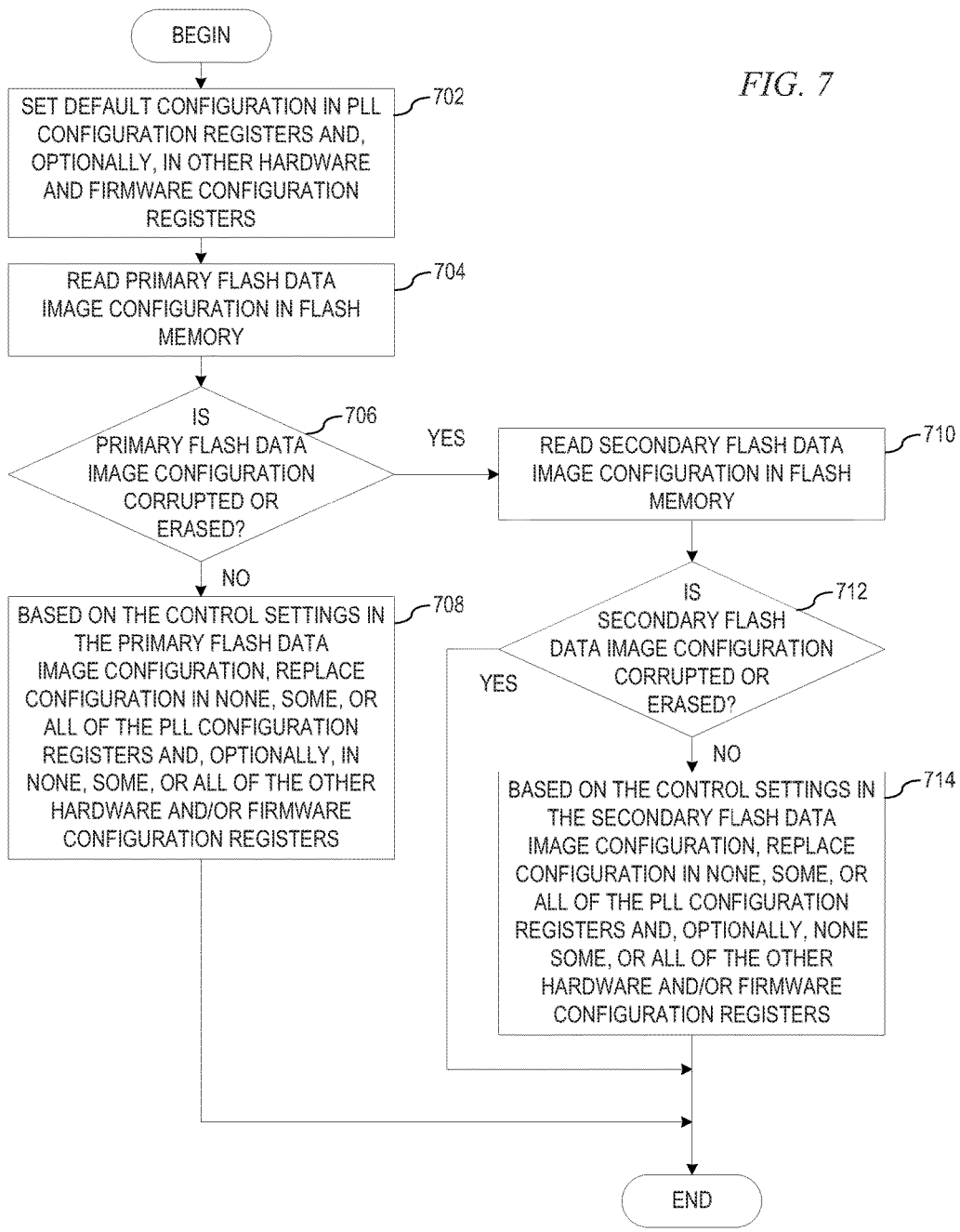
FIG. 7 depicts a flowchart of the operation performed by a mechanism for loading a phase-locked loop (PLL), hardware, and/or firmware configuration into a PLL module within a device in accordance with an illustrative embodiment.

FIG. 7 depicts a flowchart of the operation performed by a mechanism for loading a phase-locked loop (PLL), hardware, and/or firmware configuration into a PLL module within a device in accordance with an illustrative embodiment. As the operation begins, the configuration loading mechanism sets a default configuration in PLL configuration registers and, optionally, in other hardware and firmware configuration registers (step 702). The configuration loading mechanism then reads a primary Flash data image configuration in Flash memory (step 704). The configuration loading mechanism determines whether the primary Flash data image configuration is corrupted or erased (step 706) using error checking such as Hamming codes, Error-Correcting Code (ECC), Longitudinal Redundancy Check (LRC), or Cyclic Redundancy Code (CRC). If at step 706 the configuration loading mechanism determines that the primary Flash data image configuration is not corrupted or erased, the configuration loading mechanism, based on the control settings in the primary Flash data image configuration, replaces the configuration in none, some, or all of the PLL configuration registers and, optionally, in none, some, or all of the other hardware and/or firmware configuration registers (step 708), with the operation terminating thereafter.

Returning to step 706, if at step 706 the configuration loading mechanism determines that the primary Flash data image configuration is corrupted or erased, the configuration loading mechanism then reads a secondary Flash data image configuration in Flash memory (step 710). The configuration loading mechanism determines whether the secondary Flash data image configuration is corrupted or erased (step 712) using error checking such as Hamming codes, Error-Correcting Code (ECC), Longitudinal Redundancy Check (LRC), or Cyclic Redundancy Code (CRC). If at step 712 the configuration loading mechanism determines that the secondary Flash data image configuration is not corrupted or erased, the configuration loading mechanism, based on the control settings in the secondary Flash data image configuration, replaces the configuration in none, some, or all of the PLL configuration registers and, optionally, in none, some, or all of the other hardware and/or firmware configuration registers (step 714), with the operation terminating thereafter. Returning to step 712, if at step 712 the configuration loading mechanism determines that the secondary Flash data image configuration is corrupted or erased, the configuration loading mechanism terminates the operation and uses the default configuration that was set in step 702.

The flowcharts and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Thus, the illustrative embodiments provide mechanisms for using Flash memory to load a device's PLL configuration at boot time while ensuring that any errors in the Flash data image on the Flash memory (and hence with the PLL configuration contained within) do not prevent the PLL from locking. The illustrative embodiments initialize the device using known default configuration settings (already hard wired into the device design). These settings are guaranteed to cause the PLL to lock (but perhaps not at the frequency required by the particular application). Any non-corrupted PLL configuration information contained within the Flash data image on the Flash memory is then loaded onto the PLL module if the PLL configuration from the Flash data image differs from the default configuration settings. The illustrative embodiments drive the module inputs with the PLL configuration identified in the Flash data image from the Flash memory and reset the PLL module so that the PLL module boots at the desired clock frequency.

The mechanisms of the illustrative embodiments have the advantage over the strapping resistors implementation in that the instant mechanisms do not rely on using pullups/pulldowns to configure the PLL module. This saves on PCB space and using a Flash memory means that PLL configuration is more flexible. The Flash data image configuration may be upgraded while the PCB is in the field. Further, the mechanisms of the illustrative embodiments have the advantage over the standard method of Flash memory initialization as the instant mechanisms will not allow a corrupted Flash data image configuration to initialize the PLL module that would prevent the PLL from locking. The device may still operate (albeit using default PLL settings). Running in this mode may be acceptable until the Flash data image configuration is corrected (by reloading the Flash data image configuration). At the very least the device is operational enough to report the initialization problem which it would not have been possible had the corrupted Flash data image configuration prevented the PLL from locking and thus prevented the device from functioning at all.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a communication bus, such as a system bus, for example. The memory elements can include local memory employed during actual execution of the program code, bulk storage, and cache memories which provide temporary storage of at least some program code in order to reduce the number of times code must be retrieved from bulk storage during execution. The memory may be of various types including, but not limited to, ROM, PROM, EPROM, EEPROM, DRAM, SRAM, Flash memory, solid state memory, and the like.

Input/output or I/O devices (including but not limited to keyboards, displays, pointing devices, etc.) can be coupled to the system either directly or through intervening wired or wireless I/O interfaces and/or controllers, or the like. I/O devices may take many different forms other than conventional keyboards, displays, pointing devices, and the like, such as for example communication devices coupled through wired or wireless connections including, but not limited to, smart phones, tablet computers, touch screen devices, voice recognition devices, and the like. Any known or later developed I/O device is intended to be within the scope of the illustrative embodiments.

Network adapters may also be coupled to the system to enable the data processing system to become coupled to other data processing systems or remote printers or storage devices through intervening private or public networks. Modems, cable modems and Ethernet cards are just a few of the currently available types of network adapters for wired communications. Wireless communication based network adapters may also be utilized including, but not limited to, 802.11 a/b/g/n wireless communication adapters, Bluetooth wireless adapters, and the like. Any known or later developed network adapters are intended to be within the spirit and scope of the present invention.

The description of the present invention has been presented for purposes of illustration and description, and is not intended to be exhaustive or limited to the invention in the form disclosed. Many modifications and variations will be apparent to those of ordinary skill in the art without departing from the scope and spirit of the described embodiments. The embodiment was chosen and described in order to best explain the principles of the invention, the practical application, and to enable others of ordinary skill in the art, to understand the invention for various embodiments with various modifications as are suited to the particular use contemplated. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for loading a phase-locked loop (PLL) configuration into a PLL module of an Application Specific Integrated Circuit (ASIC) using Flash memory, the method comprising:
    responsive to the PLL module in the ASIC locking a current PLL configuration from a set of current configuration registers in the ASIC, loading, by reset logic in the ASIC, a Flash data image configuration from the Flash memory into a set of holding registers in the ASIC;
    responsive to the Flash data image configuration failing to be corrupted, comparing, by comparison logic in the ASIC, the Flash data image configuration in the set of holding registers to the current PLL configuration in the set of current configuration registers;
    responsive to the Flash data image configuration differing from the current PLL configuration, loading, by the reset logic, the Flash data image configuration onto a PLL module input; and
    responsive to the PLL module locking the Flash data image configuration, loading by the reset logic, the Flash data image configuration in the set of holding registers into the set of current configuration registers.

2. The method of claim 1, further comprising:
resetting, by the reset logic, the PLL module by asserting a reset line so that the PLL module locks the Flash data image configuration.

3. The method of claim 1, further comprising:
responsive to the Flash data image configuration being corrupted, setting, by error checking logic in the ASIC, a "Bad Flash Data Image" flag that notifies a user that the Flash data image configuration has failed.

4. The method of claim 1, wherein determining whether the Flash data image configuration is corrupt or erased utilizes at least one of Hamming codes, Error-Correcting Code (ECC), Longitudinal Redundancy Check (LRC), or Cyclic Redundancy Code (CRC).

5. The method of claim 1, further comprising:
responsive to the Flash data image configuration being the same as the current PLL configuration, recognizing, by the reset logic, that the PLL module is configured with the most up-to-date PLL configuration.

6. The method of claim 1, further comprising:
responsive to the Flash data image configuration comprising a flag indicating that the current PLL configuration is to be replaced regardless of any comparison of the Flash data image configuration the current PLL configuration indicating a difference or not, loading, by the reset logic, the Flash data image configuration onto a PLL module input; and
responsive to the PLL module locking the Flash data image configuration, loading, by the reset logic, the Flash data image configuration in the set of holding registers into the set of current configuration registers.

7. The method of claim 1, wherein the Flash data image configuration is a first Flash data image configuration and wherein method further comprises:
responsive to the first Flash data image configuration being corrupt, loading, by the set logic, a second Flash data image configuration from the Flash memory into the set of holding registers;
responsive to the second Flash data image configuration failing to be corrupt or erased, comparing, by the comparison logic, the second Flash data image configuration in the set of holding registers to the current PLL configuration in the set of current configuration registers;
responsive to the second Flash data image configuration differing from the current PLL configuration, loading, by the reset logic, the second Flash data image configuration onto a PLL module input; and
responsive to the PLL module locking the second Flash data image configuration, loading, by the reset logic, the second Flash data image configuration in the set of holding registers into the set of current configuration registers.

8. The method of claim 1, wherein the PLL module locks the current PLL configuration from the set of current configuration registers by:
determining, by the reset logic, whether there a PLL configuration is already loaded into the set of current configuration registers;
responsive to PLL configuration existing in the set of current configuration registers, loading, by the reset logic, a default PLL configuration into the set of current configuration registers thereby forming the current PLL configuration; and
asserting, by the reset logic, a selection signal so that the current PLL configuration in the set of current configuration registers is loaded onto the PLL module input.

9. A computer program product comprising a computer readable storage medium having a computer readable program for loading a phase-locked loop (PLL) configuration into a PLL module of an Application Specific Integrated Circuit (ASIC) using Flash memory, wherein the computer readable program, when executed on a computing device, causes the computing device to:
responsive to the PLL module in the ASIC locking a current PLL configuration from a set of current configuration registers in the ASIC, load, by reset logic in the ASIC, a Flash data image configuration from the Flash memory into a set of holding registers in the ASIC;
responsive to the Flash data image configuration failing to be corrupted, compare, by comparison logic in the ASIC, the Flash data image configuration in the set of holding registers to the current PLL configuration in the set of current configuration registers;
responsive to the Flash data image configuration differing from the current PLL configuration, load, by the reset logic, the Flash data image configuration onto a PLL module input; and
responsive to the PLL module locking the Flash data image configuration, load, by the reset logic, the Flash data image configuration in the set of holding registers into the set of current configuration registers.

10. The computer program product of claim 9, wherein the computer readable program further causes the computing device to:
reset, by the reset logic, the PLL module by asserting a reset line so that the PLL module locks the Flash data image configuration.

11. The computer program product of claim 9, wherein the computer readable program further causes the computing device to:
responsive to the Flash data image configuration being corrupted, set, by error checking logic in the ASIC, a "Bad Flash Data Image" flag that notifies a user that the Flash data image configuration has failed.

12. The computer program product of claim 9, wherein the computer readable program further causes the computing device to:
responsive to the Flash data image configuration comprising a flag indicating that the current PLL configuration is to be replaced regardless of any comparison of the Flash data image configuration the current PLL configuration indicating a difference or not, load, by the reset logic, the Flash data image configuration onto a PLL module input; and
responsive to the PLL module locking the Flash data image configuration, load, by the reset logic, the Flash data image configuration in the set of holding registers into the set of current configuration registers.

13. The computer program product of claim 9, wherein the Flash data image configuration is a first Flash data image configuration and wherein the computer readable program further causes the computing device to:
responsive to the first Flash data image configuration being corrupt, load, by the reset logic, a second Flash data image configuration from the Flash memory into the set of holding registers;
responsive to the second Flash data image configuration failing to be corrupt or erased, compare, by the comparison logic, the second Flash data image configuration in the set of holding registers to the current PLL configuration in the set of current configuration registers;

responsive to the second Flash data image configuration differing from the current PLL configuration, load, by the reset logic, the second Flash data image configuration onto a PLL module input; and responsive to the PLL module locking the second Flash data image configuration, load, by the reset logic, the second Flash data image configuration in the set of holding registers into the set of current configuration registers.

14. The computer program product of claim 9, wherein the PLL module locks the current PLL configuration from the set of current configuration registers by the computer readable program further causing the computing device to:

determine, by the reset logic, whether there a PLL configuration is already loaded into the set of current configuration registers;

responsive to PLL configuration existing in the set of current configuration registers, load, by the reset logic, a default PLL configuration into the set of current configuration registers thereby forming the current PLL configuration; and assert, by the reset logic, a selection signal so that the current PLL configuration in the set of current configuration registers is loaded onto the PLL module input.

15. An apparatus for loading a phase-locked loop (PLL) configuration into a PLL module of an Application Specific Integrated Circuit (ASIC) using Flash memory comprising:

a processor; and a memory coupled to the processor, wherein the memory comprises instructions which, when executed by the processor, cause the processor to:

responsive to the PLL module locking a current PLL configuration from a set of current configuration registers in the ASIC, load, by reset logic in the ASIC, a Flash data image configuration from the Flash memory into a set of holding registers in the ASIC;

responsive to the Flash data image configuration failing to be corrupted, compare, by comparison logic in the ASIC, the Flash data image configuration in the set of holding registers to the current PLL configuration in the set of current configuration registers;

responsive to the Flash data image configuration differing from the current PLL configuration, load, by the reset logic, the Flash data image configuration onto a PLL module input; and responsive to the PLL module locking the Flash data image configuration, load, by the reset logic, the Flash data image configuration in the set of holding registers into the set of current configuration registers.

16. The apparatus of claim 15, wherein the instructions further cause the processor to:

reset, by the reset logic, the PLL module by asserting a reset line so that the PLL module locks the Flash data image configuration.

17. The apparatus of claim 15, wherein the instructions further cause the processor to:

responsive to the Flash data image configuration being corrupted, set, by error checking logic in the ASIC, a "Bad Flash Data Image" flag that notifies a user that the Flash data image configuration has failed.

18. The apparatus of claim 15, wherein the instructions further cause the processor to:

responsive to the Flash data image configuration comprising a flag indicating that the current PLL configuration is to be replaced regardless of any comparison of the Flash data image configuration the current PLL configuration indicating a difference or not, load, by the reset logic, the Flash data image configuration onto a PLL module input; and responsive to the PLL module locking the Flash data image configuration, load, by the reset logic, the Flash data image configuration in the set of holding registers into the set of current configuration registers.

19. The apparatus of claim 15, wherein the Flash data image configuration is a first Flash data image configuration and wherein the instructions further cause the processor to:

responsive to the first Flash data image configuration being corrupt, load, by the reset logic, a second Flash data image configuration from the Flash memory into the set of holding registers;

responsive to the second Flash data image configuration failing to be corrupt or erased, compare, by the comparison logic, the second Flash data image configuration in the set of holding registers to the current PLL configuration in the set of current configuration registers;

responsive to the second Flash data image configuration differing from the current PLL configuration, load, by the reset logic, the second Flash data image configuration onto a PLL module input; and responsive to the PLL module locking the second Flash data image configuration, load, by the reset logic, the second Flash data image configuration in the set of holding registers into the set of current configuration registers.

20. The apparatus of claim 15, wherein the PLL module locks the current PLL configuration from the set of current configuration registers by the instructions further causing the processor to:

determine, by the reset logic, whether there a PLL configuration is already loaded into the set of current configuration registers;

responsive to PLL configuration existing in the set of current configuration registers, load, by the reset logic, a default PLL configuration into the set of current configuration registers thereby forming the current PLL configuration; and assert, the reset logic, a selection signal so that the current PLL configuration in the set of current configuration registers is loaded onto the PLL module input.

\* \* \* \* \*